(12) United States Patent
Hanazaki

(10) Patent No.: US 9,504,142 B2
(45) Date of Patent: Nov. 22, 2016

(54) FLEXIBLE FLAT CIRCUIT

(71) Applicant: YAZAKI CORPORATION, Tokyo (JP)

(72) Inventor: Hisashi Hanazaki, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/629,697

(22) Filed: Feb. 24, 2015

(65) Prior Publication Data

US 2015/0245469 A1  Aug. 27, 2015

(30) Foreign Application Priority Data

Feb. 25, 2014 (JP) ................. 2014-034209

(51) Int. Cl.
| | | |
|---|---|---|
| *H05K 1/02* | (2006.01) | |
| *H01B 7/08* | (2006.01) | |
| *H05K 1/18* | (2006.01) | |
| *H05K 1/03* | (2006.01) | |
| *H05K 3/10* | (2006.01) | |
| *H05K 3/12* | (2006.01) | |

(52) U.S. Cl.
CPC .......... *H05K 1/0263* (2013.01); *H01B 7/0838* (2013.01); *H05K 1/028* (2013.01); *H05K 1/0265* (2013.01); *H05K 1/0293* (2013.01); *H05K 1/181* (2013.01); *H05K 3/102* (2013.01); *H05K 3/1275* (2013.01); *H05K 1/0393* (2013.01); *H05K 3/101* (2013.01); *H05K 3/125* (2013.01); *H05K 2201/0305* (2013.01); *H05K 2201/09281* (2013.01); *H05K 2201/09727* (2013.01); *H05K 2201/09736* (2013.01); *H05K 2201/10181* (2013.01); *H05K 2203/107* (2013.01)

(58) Field of Classification Search
CPC ....... H05K 1/02; H05K 1/0263; H05K 1/028
USPC ........................................................ 174/254
See application file for complete search history.

(56) References Cited

U.S. PATENT DOCUMENTS

| | | | |
|---|---|---|---|
| 3,500,276 A | | 3/1970 | Hingorany et al. |
| 5,923,239 A | * | 7/1999 | Krueger ............... H01H 69/022 337/152 |
| 6,848,178 B2 | * | 2/2005 | Kondo .................. H01L 23/498 174/266 |
| 8,633,707 B2 | * | 1/2014 | Filippi .................... H01L 23/58 324/507 |
| 2013/0118792 A1 | * | 5/2013 | Min ........................ H05K 1/02 174/262 |

(Continued)

FOREIGN PATENT DOCUMENTS

| | | |
|---|---|---|
| DE | 1803554 | 5/1969 |
| DE | 10157678 A1 | 6/2003 |

(Continued)

OTHER PUBLICATIONS

Communication dated Dec. 21, 2015, issued by the German Patent Office in counterpart German Application No. 102015203363.5.

*Primary Examiner* — Timothy Thompson
*Assistant Examiner* — Stanley Tso
(74) *Attorney, Agent, or Firm* — Sughrue Mion, PLLC

(57) ABSTRACT

A flexible flat circuit includes a pair of insulation sheets, and a plurality of conductors that are held between and covered with the pair of insulation sheets in a state that the plurality of conductors are separated to each other. Among from the plurality of conductors, at least conductors with different current capacities are different in thickness to each other.

6 Claims, 6 Drawing Sheets

(56) References Cited

U.S. PATENT DOCUMENTS

| | | | | |
|---|---|---|---|---|
| 2013/0200531 A1* | 8/2013 | Myung | ............... | H05K 1/0298 257/778 |
| 2014/0014399 A1* | 1/2014 | Kariya | ..................... | H05K 1/02 174/250 |
| 2014/0216796 A1* | 8/2014 | Maeda | ..................... | H05K 1/02 174/255 |
| 2014/0360568 A1* | 12/2014 | Komai | ............. | H01L 31/02008 136/256 |

FOREIGN PATENT DOCUMENTS

| | | |
|---|---|---|
| GB | 2099228 A | 12/1982 |
| JP | 2004-23978 A | 1/2004 |

\* cited by examiner

FLEXIBLE FLAT CIRCUIT

BACKGROUND

The present invention relates to a flexible flat circuit, such as an FPC (Flexible Printed Circuit) or an FFC (Flexible Flat Cable), having a plurality of conductors with different current capacities.

FIG. 6 is a view illustrating the flexible flat circuit disclosed in JP-A-2004-23978 described below.

In this flexible flat circuit 100, a plurality of conductors 111 and 112 for providing a circuit are formed on an insulation sheet 101 made of an insulating resin in a separated state. Furthermore, a fuse circuit 120 for making a connection between the two conductors 111 and 112 is provided on the conductors 111 and 112. An insulation sheet, not illustrated, for covering the conductors 111 and 112 and the fuse circuit 120 described above is formed in a laminated state on the insulation sheet 101. The insulation sheet for covering the conductors 111 and 112 and the fuse circuit 120 is identical with the insulation sheet 101.

In other words, the flexible flat circuit 100 is configured that the plurality of conductors 111 and 112 and the fuse circuit 120 are held between the pair of insulation sheets 101.

Conventionally, the conductors 111 and 112 on the insulation sheet 101 are formed so as to have a uniform thickness by a subtractive method or an additive method.

The subtractive method is a method for forming the conductors 111 and 112, wherein a copper foil is attached to the entire surface of the insulation sheet 101, a coating film layer serving as a corrosion resistant film is formed in regions to be left as the conductors 111 and 112 on the copper foil, and the copper foil on unnecessary portions (regions having no coating film layer) are eliminated by etching.

The active method is a method for forming the conductors 111 and 112, wherein a resist (plating resist) is formed on the portions of the surface of the insulation sheet 101 on which the conductors 111 and 112 are not desired to be formed, and electrolytic plating or electroless plating is performed on portions having no resist.

Furthermore, in the case of the conventional flexible flat circuit 100, the fuse circuit 120 is formed as an independent component equipped with a pair of connection terminal sections 121 to be connected to the conductors 111 and 112 by soldering or the like and a fusible body 122 for making a connection between the pair of connection terminal sections 121, and then soldered to the conductors 111 and 112. The material and the cross-sectional dimensions of the fusible body 122 are set so that the fusible body 122 is fused when a current equal to or more than the rated current flows between the pair of connection terminal sections 121.

However, in the case of the flexible flat circuit 100 according to JP-A-2004-23978, the conductors 111 and 112 for forming a circuit are formed by the subtractive method or the additive method and have a uniform thickness. Hence, in the case that the current capacities of the respective conductors 111 and 112 are changed depending on the rating of an electric circuit serving as the connection destination of the conductors 111 and 112, the conductors 111 and 112 are required to secure necessary cross-sectional areas by changing the width dimensions of the respective conductors 111 and 112.

In other words, for example, when a conductor which is connected to a power source (battery) and through which large currents flow is compared with a conductor through which small currents, such as control signals, flow, the width of the former conductor, through which the large currents flows, is required to be set large. The increase in the width of the conductor results in an increase in the width dimension of the flexible flat circuit 100 itself. This causes a problem of the upsizing of the flexible flat circuit 100.

In addition, in the case of the flexible flat circuit 100 according to JP-A-2004-23978, the fuse circuit 120 to be mounted on the flexible flat circuit 100 is formed as a separate component and then connected to the conductors 111 and 112 by soldering or the like. This causes problems, i.e., an increase in the number of components, an increase in the number of processing steps, an increase in cost, and a decrease in productivity.

Accordingly, for the purpose of solving the above-mentioned problems, an object of the present invention is to provide a flexible flat circuit on which conductors with large current capacities and having the same width dimension as that of conductors with small current capacities can be mounted, whereby the width dimension of the flexible flat circuit can be shortened. Furthermore, another object of the present invention is to provide a flexible flat circuit on which a fuse circuit can be mounted easily on a conductor formed on the flexible flat circuit.

SUMMARY

The objects of the present invention described above are achieved by using the following configurations.

(1) A flexible flat circuit includes a pair of insulation sheets and a plurality of conductors that are held between and covered with the pair of insulation sheets so that the plurality of conductors are separated to each other, wherein among from the plurality of conductors, at least conductors with different current capacities are different in thickness to each other.

(2) The flexible flat circuit described in the above item [1], wherein the at least conductors with different current capacities are different in width to each other.

(3) The flexible flat circuit described in the above item (1) or (2), wherein a stereoscopic shaping method is used to form the plurality of conductors.

(4) The flexible flat circuit described in any one of the above items [1] to [3], wherein a fuse circuit is formed in at least one of the plurality of conductors by stacking a low-melting point metal layer using a stereoscopic shaping method.

(5) The flexible flat circuit described in any one of the above items [1] to [4], wherein top faces of the at least conductors with different current capacities are flush with to each other.

(6) The flexible flat circuit described in any one of the above items [1] to [5], wherein among from the at least conductors, a conductor with large current capacity is embedded in one of the pair of insulation sheets and a conductor with small current capacity smaller than the large current capacity is provided on the one of the pair of insulation sheets.

With the configuration described in the above items, among from the plurality of conductors held between the insulation sheets, at least the conductors with different current capacities are made different at least in thickness, whereby desired current capacities are secured.

In other words, in comparison with the conventional case in which the required current capacity is set by changing only the width of a conductor, in the case of the conductor with the large current capacity, the increase in the width dimension thereof can be suppressed by the increased thickness dimension thereof. Hence, in the flexible flat circuit having the plurality of conductors with different current capacities, the width of the conductor with the large current capacity is narrowed, whereby the width dimension of the flexible flat circuit can be shortened.

In conductors with different current capacities, in the case that both the thickness and the width of the conductors are changed, the difference in current capacity can be identified by comparing their widths by visual inspection. Hence, in the case that an external circuit is connected on-site to the flexible flat circuit produced as described above, the current capacities of the respective conductors can be determined by visual inspection, and incorrect connection can be suppressed.

Furthermore, in the case that the conductors with the same current capacity are made different in thickness and width, the plurality of conductors disposed on the insulation sheet can be identified by comparing their widths, thereby being helpful, for example, for confirming connection destination.

In the case that the width dimensions of the plurality of conductors are aligned to the width dimension of the conductor with the minimum current capacity and only the thickness dimensions thereof are made different depending on the required current capacities, the width dimension of the flexible flat circuit can be minimized.

With the configuration described in the above items, the plurality of conductors to be held between the insulation sheets are formed by the stereoscopic shaping method (three-dimensional shaping method) using the so-called 3D printer. With the stereoscopic shaping method, a stereoscopic structure having desired dimensions and shape can be formed easily by inputting the three-dimensional data of portions to be formed into the 3D printer.

In other words, with the configuration described in the above items, the respective conductors can be formed easily by inputting the three-dimensional data indicating the cross sections of the conductors to the 3D printer so that the current capacities required for the respective conductors are satisfied.

Still further, in the case of the conductor with the large current capacity, the desired current capacity can be secured by performing setting so that both the width dimension data and the thickness dimension data are larger than those of the conductors with the small current capacity while the increase in the width dimension of the conductor is suppressed, in comparison with the case in which only the width dimension data is increased. As a result, the width dimension of the flexible flat circuit equipped with the plurality of conductors with different current capacities can be shortened easily.

With the configuration described in the above items, the fuse circuit is integrally formed with the conductor to which the fuse circuit is connected, by the stereoscopic shaping method using the 3D printer. Hence, it is not necessary to produce the fuse circuit at a separate process, and the process for soldering the completed fuse circuit to the conductor is eliminated. As a result, the fuse circuit can be mounted easily on the conductor and the flexible flat circuit having the fuse circuit can be produced easily.

With the flexible flat circuit according to the present invention, conductors with large current capacities and having the same width dimension as that of conductors with small current capacities can be mounted, whereby the width dimension of the flexible flat circuit can be shortened.

The present invention has been described above briefly. The details of the present invention will be further clarified by reading the description of the modes (hereafter referred to as "embodiments") for carrying out the invention described below referring to the accompanying drawings.

DETAILED DESCRIPTION OF THE EXEMPLARY EMBODIMENTS

Figure 1:
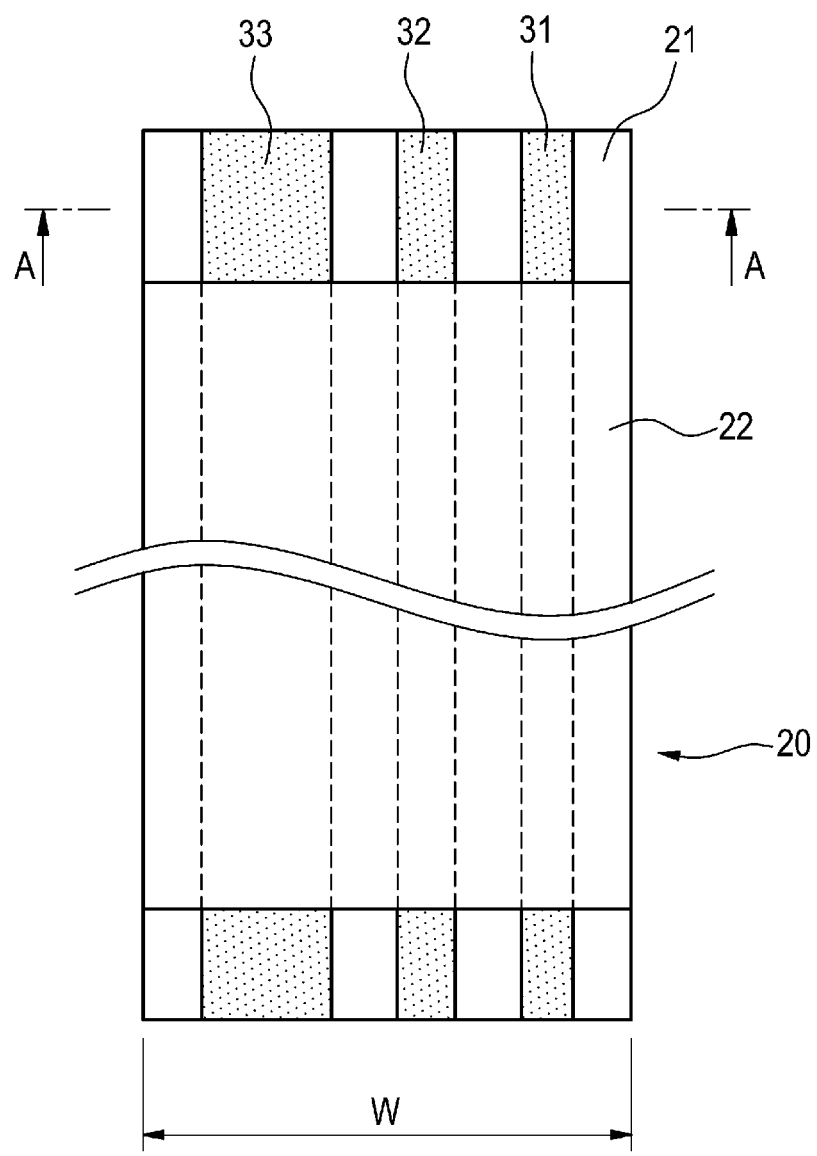
FIG. 1 is a top view illustrating a flexible flat circuit according to a first embodiment of the present invention.

Preferred embodiments of a flexible flat circuit according to the present invention will be described below referring to the drawings.

First Embodiment

Figure 2:
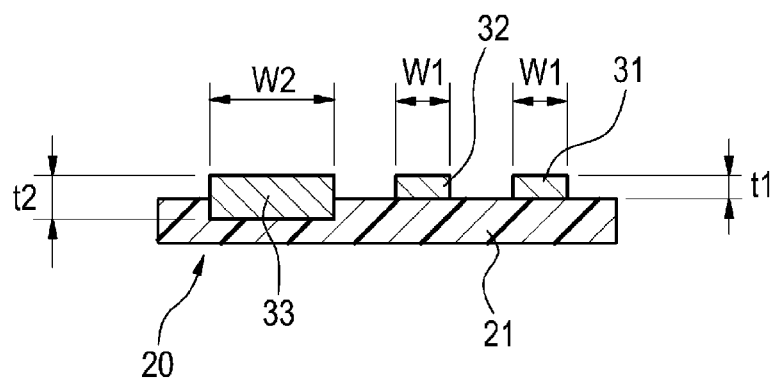
FIG. 2 is a cross-sectional view taken on line A-A of FIG. 1.

FIGS. 1 and 2 are views illustrating the flexible flat circuit according to a first embodiment of the present invention; FIG. 1 is a top view illustrating the flexible flat circuit according to the first embodiment of the present invention, and FIG. 2 is a cross-sectional view taken on line A-A of FIG. 1.

In the flexible flat circuit 20 according to the first embodiment, three conductors 31, 32 and 33 are held between and covered with a pair of insulation sheets 21 and 22 in a separated state.

Furthermore, among from the three conductors 31, 32 and 33, the conductors 31 and 32 are conductors having the same current capacity. The conductors 31 and 32 are both circuit traces for transmitting small currents, such as control signals, and have a small current capacity. The conductor 33 is a conductor to be connected to a power source (battery) and is a circuit trace for transmitting currents larger than those transmitted by the conductors 31 and 32, and the current capacity thereof is set so as to be larger than that of the conductors 31 and 32.

In the case of this embodiment, the current capacity of the conductors 31 and 32 is different from that of the conductor 33, and both the thickness and the width of the conductors 31 and 32 are made different from those of the conductor 33.

Both the conductors 31 and 32 having the small and same current capacity are set so as to have a width dimension W1 and a thickness dimension t1 as illustrated in FIG. 2.

On the other hand, in the conductor 33 having a current capacity larger than that of the conductors 31 and 32, the width and thickness thereof are made larger than those of the conductors 31 and 32. The thickness and the width of the conductor 33 are set to a thickness dimension t2 and a width dimension W2, t2>t1 and W2>W1, as illustrated in FIG. 2.

Moreover, in the case of this embodiment, the conductors 31, 32 and 33 are all formed by the stereoscopic shaping method (three-dimensional shaping method).

The stereoscopic shaping method herein means a method for forming a stereoscopic structure using the so-called 3D printer. In the case of this embodiment, as the 3D printer, various kinds of known printers can be used.

The stereoscopic shaping method is a method in which the three-dimensional shape data of a product is sliced into thin layers on a computer, the cross-sectional shapes of the respective sliced layers are calculated, the thin layers are made physically in order according to the calculated data, and the thin layers are laminated and combined to form a product having a three-dimensional shape.

For the stereoscopic shaping method, the fused deposition molding system, optical shaping system, powder sintering system, inkjet system, projection system and inkjet powder lamination system are available, and 3D printers of these systems can be used.

For example, in the powder sintering system, shaping is performed in the following order.

(1) Material powder is spread thinly on a shaping bed.

(2) In cross-sectional shapes, the cross-sectional shape of the lowest layer is drawn using a laser beam, electron beam or ultraviolet beam, and the powder of the drawn portion is sintered.

(3) After the cross-section of the lowest layer is sintered, the bed is lowered by the height that is equal to a slice interval, and the material powder is spread on the bed to the thickness equal to the slice interval.

(4) The cross-sectional shape of the one-upper layer of the layer formed earlier is drawn again by laser drawing and then sintered.

(5) A stereoscopic object is formed by repeating the above-mentioned steps.

Furthermore, in the case of the inkjet powder lamination system, material powder is discharged in the manner of an ink jet printer, and a laser beam, ultraviolet beam or heat is applied to the material powder to sinter the material powder. The lamination and sintering of the thin layers are repeated in order to shape an integrated three-dimensional object.

In the flexible flat circuit 20 according to the first embodiment described above, among from the plurality of conductors 31, 32 and 33 to be held between the insulation sheets 21 and 22, the conductors with different current capacities can respectively secure desired current capacities by changing the thickness and width thereof.

In other words, in comparison with the conventional case in which the required current capacity is set by changing only the width of a conductor, in the case of the conductor 33 with the large current capacity, the increase in the width dimension thereof can be suppressed by the increased thickness dimension thereof. Hence, in the flexible flat circuit 20 having the plurality of conductors with different current capacities, the width of the conductor 33 with the large current capacity is narrowed, whereby the width dimension W (see FIG. 1) of the flexible flat circuit 20 can be shortened.

In conductors with different current capacities, in the case that both the thickness and the width of the conductors are changed, the difference in current capacity can be identified by comparing their widths by visual inspection. Hence, in the case that an external circuit is connected on-site to the flexible flat circuit 20 produced as described above, the current capacities of the respective conductors 31, 32 and 33 can be determined by visual inspection, and incorrect connection can be suppressed.

In this embodiment, the conductors with different current capacities are made different in both thickness and width. However, the respective current capacities may be secured by changing only the thickness dimension, instead of changing the width dimension. In this case, the conductor 33 with the large current capacity can be formed so as to have the same width of the conductors 31 and 32 with the small current capacity, whereby the width dimension of the flexible flat circuit 20 can be minimized.

In addition, in this embodiment, the conductors 31 and 32 with the same current capacity are the same in thickness and width. However, even the conductors with the same current capacity may be made different in thickness and width. In this case, even the conductors 31 and 32 with the same current capacity can be identified by comparing their widths, thereby being helpful, for example, for confirming connection destination.

Furthermore, in the case of the flexible flat circuit 20 according to the first embodiment, the plurality of conductors 31, 32 and 33 to be held between the insulation sheets 21 and 22 are formed by the stereoscopic shaping method (three-dimensional shaping method). With the stereoscopic shaping method, a stereoscopic structure having desired dimensions and shape can be formed easily by inputting the three-dimensional data of portions to be formed into a 3D printer.

More specifically, in the case of the flexible flat circuit 20 according to the first embodiment, the respective conductors 31, 32 and 33 can be formed easily by inputting the three-dimensional data indicating the cross sections of the conductors 31, 32 and 33 to the 3D printer so that the current capacities required for the respective conductors 31, 32 and 33 are satisfied.

Still further, in the case of the conductor 33 with the large current capacity, the desired current capacity can be secured by performing setting so that both the width dimension data and the thickness dimension data are larger than those of the conductors 31 and 32 with the small current capacity while the increase in the width dimension of the conductor 33 is suppressed, in comparison with the case in which only the width dimension data is increased. As a result, the width dimension of the flexible flat circuit 20 can be shortened easily.

Second Embodiment

Figure 3:
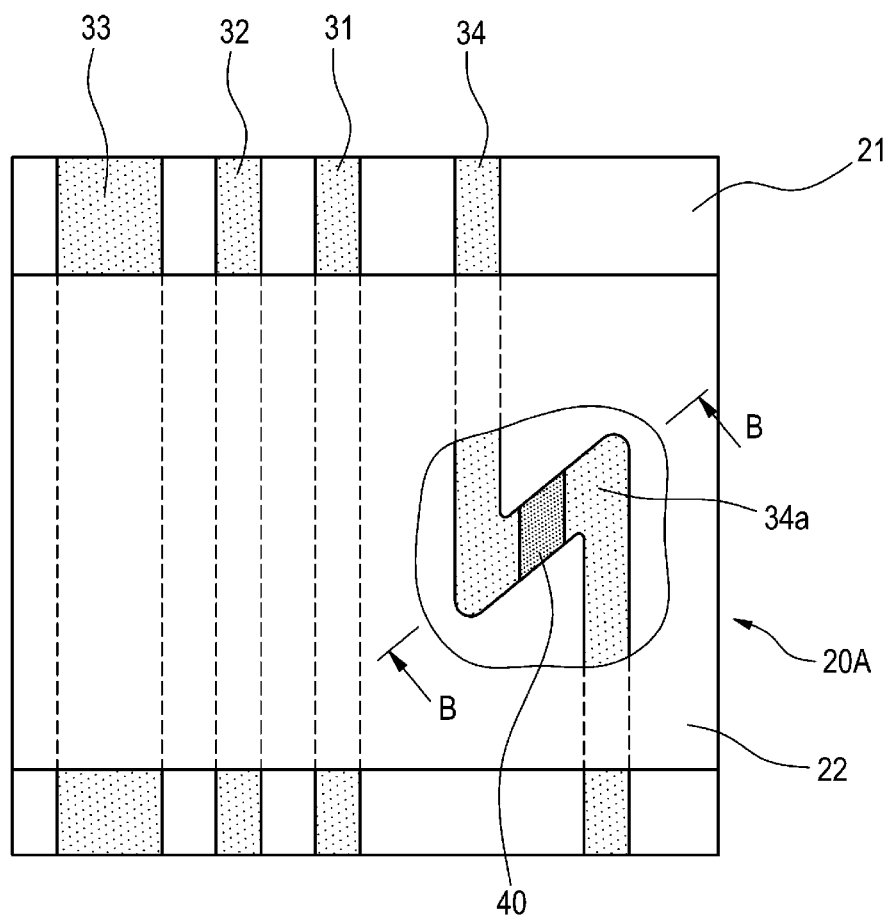
FIG. 3 is a top view illustrating the flexible flat circuit according to the first embodiment of the present invention.
Figure 4:
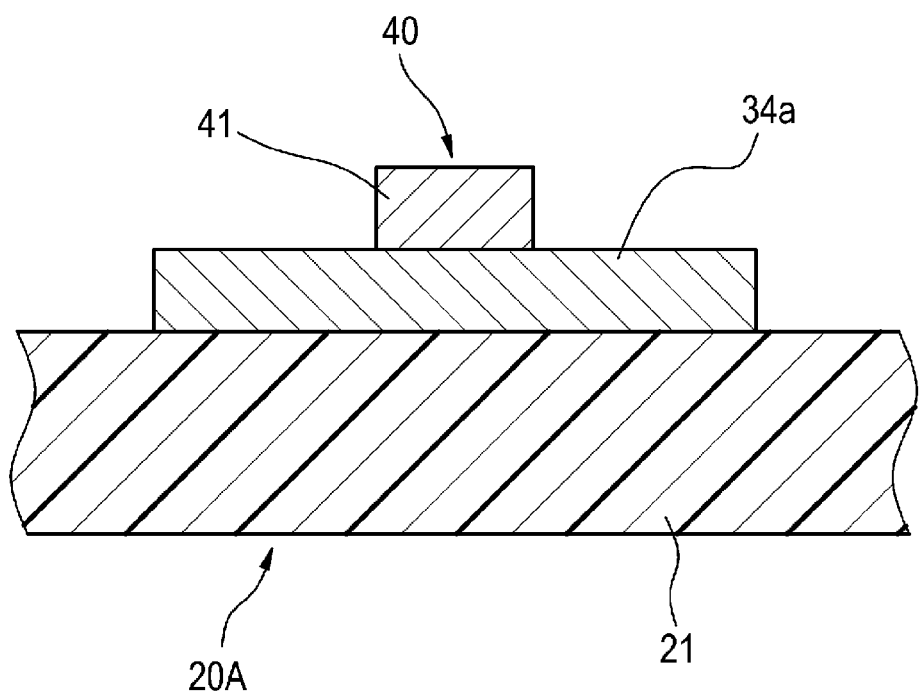
FIG. 4 is a cross-sectional view taken on line B-B of FIG. 3.
Figure 5:
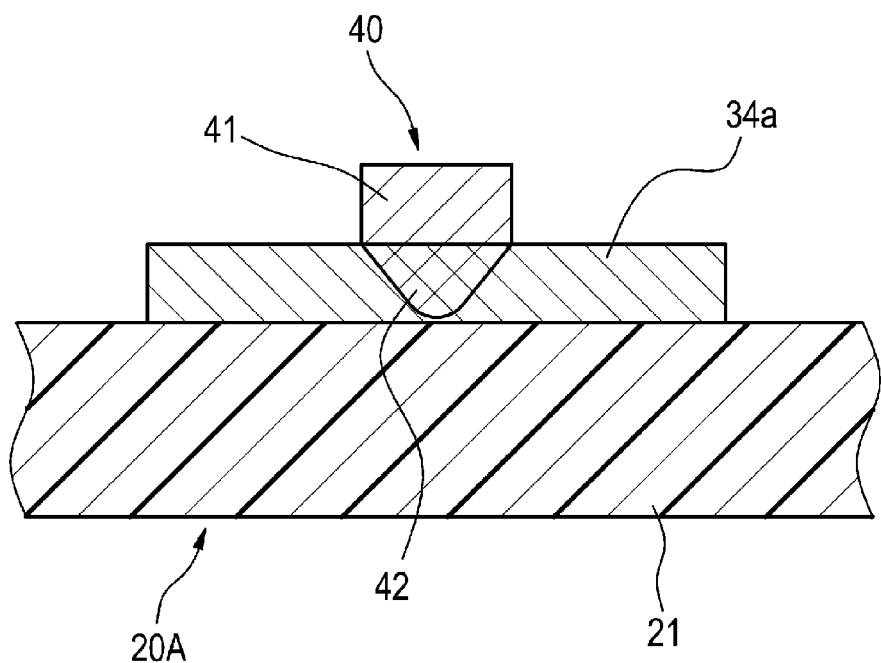
FIG. 5 is an enlarged view of FIG. 4.
Figure 6:
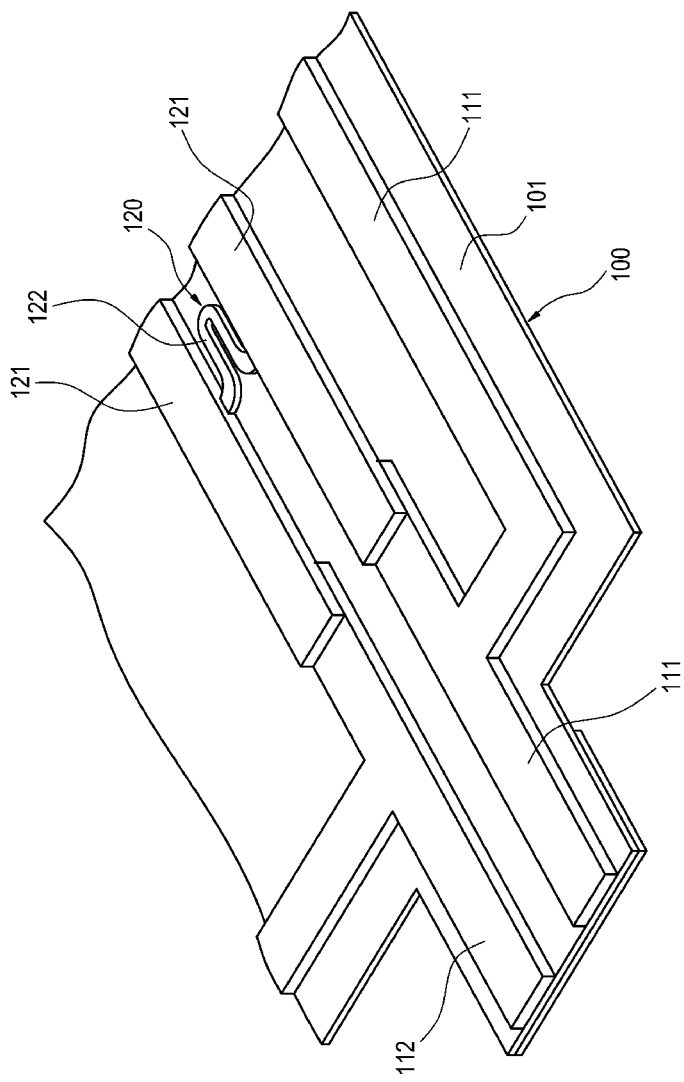
FIG. 6 is a perspective view illustrating the conventional flexible flat circuit.

FIGS. 3 to 5 are views illustrating a flexible flat circuit 20A according to a second embodiment of the present invention. FIG. 3 is a top view illustrating the flexible flat circuit 20A according to the second embodiment of the present invention, FIG. 4 is a cross-sectional view taken on line B-B of FIG. 1, and FIG. 5 is an enlarged view of FIG. 4.

In the flexible flat circuit 20A according to the second embodiment, four conductors 31, 32, 33 and 34 are held between and covered with a pair of insulation sheets 21 and 22 in a separated state.

The flexible flat circuit 20A according to the second embodiment has a structure that the conductor 34 is added to the structure of the flexible flat circuit 20 according to the first embodiment. The current capacities of the conductors 31, 32 and 33 are the same as those of the conductors 31, 32 and 33 according to the first embodiment. The current capacity of the conductor 34 that is added in the second embodiment is the same as that of the conductors 31 and 32.

Furthermore, the conductor 34 has a fuse circuit 40 at the bent section 34a of the trace thereof.

This fuse circuit 40 is made by laminating a low-melting point metal layer 41 on the bent section 34a by the stereoscopic shaping method (for example, Additive Manufacturing) using a 3D printer.

This low-melting point metal layer 41 is made of, for example, tin (Sn) having a melting point lower than that of the copper (Cu) serving as the material of the bent section 34a. When a current equal to or more than the rated current flows through the bent section 34a, the temperature of the bent section 34a is raised by the supply of electricity and melted, and a fused section 42 alloyed with the bent section 34a is formed as illustrated in FIG. 5, whereby the conductor 34 is fused.

In the case of this embodiment, the conductors 31, 32, 33 and 34 and the low-melting point metal layer 41 are all formed by the stereoscopic shaping method using a 3D printer.

In the flexible flat circuit 20A according to the second embodiment described above, the fuse circuit 40 is integrally formed with the conductor 34 to which the fuse circuit 40 is connected, by the stereoscopic shaping method using the 3D printer. Hence, it is not necessary to produce the fuse circuit 40 at a separate process, and the process for soldering the completed fuse circuit 40 to the conductor 34 is eliminated. As a result, the fuse circuit 40 can be mounted easily on the conductor 34 and the flexible flat circuit 20A having the fuse circuit 40 can be produced easily.

In the case of the flexible flat circuit bodies 20 and 20A described above, although the respective conductors 31, 32, 33 and 34 are formed by the stereoscopic shaping method using a 3D printer, the conductors 31, 32, 33 and 34 may also be formed by the subtractive method or the additive method.

However, the present invention is not limited to the above-mentioned embodiments, but can be modified and improved as necessary. In addition, the materials, shapes, dimensions, numbers, arrangement positions, etc. of the respective components in the above-mentioned embodiments may be arbitrary and not limited, provided that the present invention can be achieved.

For example, the fuse circuit may be formed on a conductor extending linearly, instead of being provided for the bent section 34a as illustrated in FIG. 3.

Moreover, the number of the conductors to be held between the pair of insulation sheets is not limited to those described in the above-mentioned respective embodiments, but can be an arbitrary number, two or more.

The features of the above-mentioned embodiments of the flexible flat circuit according to the present invention will be briefly summarized in items [1] to [3] listed below.

[1] A flexible flat circuit (20) includes a pair of insulation sheets (21 and 22) and a plurality of conductors (31, 32 and 33) that are held between and covered with the pair of insulation sheets (21 and 22) so that the plurality of conductors are separated to each other, wherein among from the plurality of conductors (31, 32 and 33), at least conductors with different current capacities are different in thickness to each other.

[2] The flexible flat circuit (20) described in the above item [1], wherein the at least conductors with different current capacities (33, 31/32) are different in width to each other.

[3] The flexible flat circuit (20) described in the above item [1] or [2], wherein a stereoscopic shaping method is used to form the plurality of conductors (31, 32 and 33).

[4] The flexible flat circuit (20A) described in any one of the above items [1] to [3], wherein a fuse circuit (40) is formed in at least one (34) of the plurality of conductors by stacking a low-melting point metal layer (41) using a stereoscopic shaping method.

[5] The flexible flat circuit (20) described in any one of the above items [1] to [4], wherein top faces of the at least conductors with different current capacities (33, 31/32) are flush with to each other.

[6] The flexible flat circuit (20) described in any one of the above items [1] to [5], wherein among from the at least conductors, a conductor with large current capacity (33) is embedded in one of the pair of insulation sheets (21 and 22) and a conductor with small current capacity (31/32) smaller than the large current capacity is provided on the one of the pair of insulation sheets (21 and 22).

The present invention is based on a Japanese patent application (Japanese Patent Application No. 2014-034209) filed on Feb. 25, 2014, the entire contents of which are incorporated herein by reference.

What is claimed is:

1. A flexible flat circuit, comprising:
a pair of insulation sheets; and
a plurality of conductors comprising a first conductor and a second conductor disposed between and covered with the pair of insulation sheets such that the plurality of conductors do not contact each other, the first conductor has a greater width and thickness and current carrying capacity that the second conductor, and the top faces of the first and second conductors are flush with each other,
wherein the entirety of the first and second conductors are disposed between and covered with the pair of insulation sheets,
wherein the first conductor is embedded in one of the pair of insulation sheets and the second conductor is provided on a surface of the one of the pair of insulation sheets, and
wherein a fuse circuit is formed on the second conductor by stacking a metallic layer on an S-shaped section of the second conductor, the metallic layer having a melting point lower than a melting point of a material of the second conductor.

2. The flexible flat circuit according to claim 1, wherein a stereoscopic shaping method is used to form the plurality of conductors.

3. The flexible flat circuit according to claim 1, wherein the fuse circuit is formed using a stereoscopic shaping method.

4. The flexible flat circuit according to claim 1, wherein the pair of insulation sheets are stacked in a stacking direction and the thickness is a distance measured in the stacking direction.

5. The flexible flat circuit according to claim 1, wherein the pair of insulation sheets are stacked in a stacking direction; and
wherein the plurality of conductors are not overlapped in the stacking direction.

6. The flexible flat circuit according to claim 1, wherein the pair of insulation sheets are stacked in a stacking direction; and
wherein the plurality of conductors are overlapped in a direction perpendicular to the stacking direction.

* * * * *